United States Patent [19]
Colligon et al.

[11] Patent Number: 4,652,357
[45] Date of Patent: Mar. 24, 1987

[54] APPARATUS FOR AND A METHOD OF MODIFYING THE PROPERTIES OF A MATERIAL

[75] Inventors: John S. Colligon; Arthur E. Hill; Hamid Kheyrandish, all of Manchester, Great Britain

[73] Assignee: University of Salford, Salford, England

[21] Appl. No.: 752,310

[22] Filed: Jul. 3, 1985

[30] Foreign Application Priority Data

Jul. 4, 1984 [GB] United Kingdom ................. 8417040

[51] Int. Cl.⁴ ............................................. G23C 14/00
[52] U.S. Cl. .................................... 204/298; 250/398; 204/192.11; 204/192.31; 204/192.32
[58] Field of Search ............... 204/298, 192 N, 192 E, 204/192 R; 250/398

[56] References Cited

U.S. PATENT DOCUMENTS

| | | | |
|---|---|---|---|
| 3,682,729 | 8/1972 | Gukelberger et al. | 204/192 N |
| 4,108,751 | 8/1978 | King | 204/192 N |
| 4,281,030 | 7/1981 | Silfvast | 204/192 N |
| 4,421,988 | 12/1983 | Robertson et al. | 250/398 |

OTHER PUBLICATIONS

Weissmantel et al., Proc. 6th Intern. Vaccum Cong., 1974, J. App. Phys. Suppl. 2, OtI, 1974, pp. 509–512.
Schiller et al., J. Vac. Sci–Tech. 12(1975), pp. 858–864.
Hudson, J. Vac. Sci. Tech. 14(1977), pp. 286–289.
Siohansi, Thin Solid Films 118(1984), pp. 61–71.

Primary Examiner—Arthur P. Demers
Attorney, Agent, or Firm—Fiddler & Levine

[57] ABSTRACT

Apparatus for and a method of modifying the properties of a material.

A single ion beam from a source in a vacuum chamber is deflected by an electrostatic deflection system between a target and a substrate. When on the target, the beam sputters material therefrom on to the substrate. When on the substrate the beam bombards material previously deposited on it from the target which mixes it with the material of the substrate. A modified surface layer may therefore be achieved. The target and substrate may be moved relative to the beam if desired and the process may be monitored and controlled using appropriate sensors and controls.

13 Claims, 6 Drawing Figures

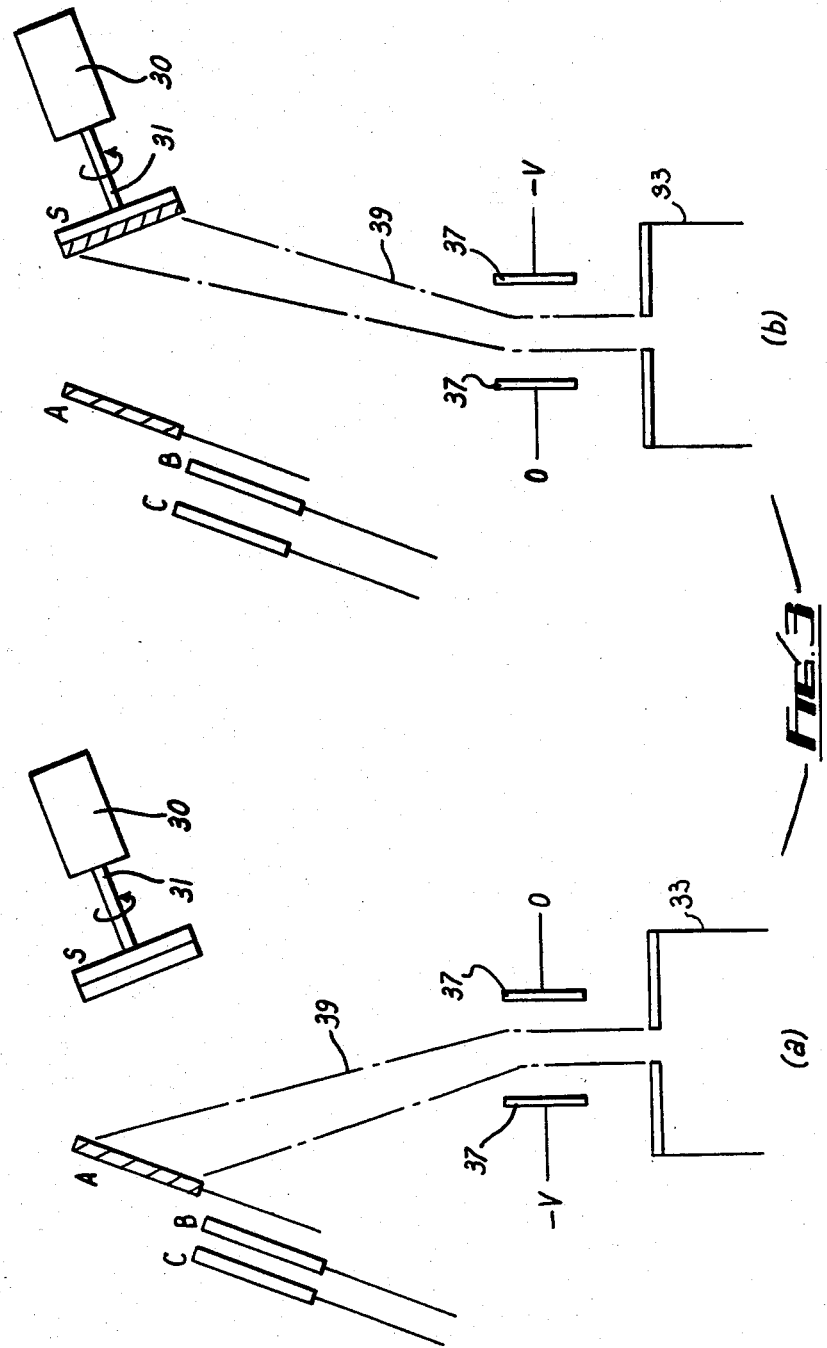

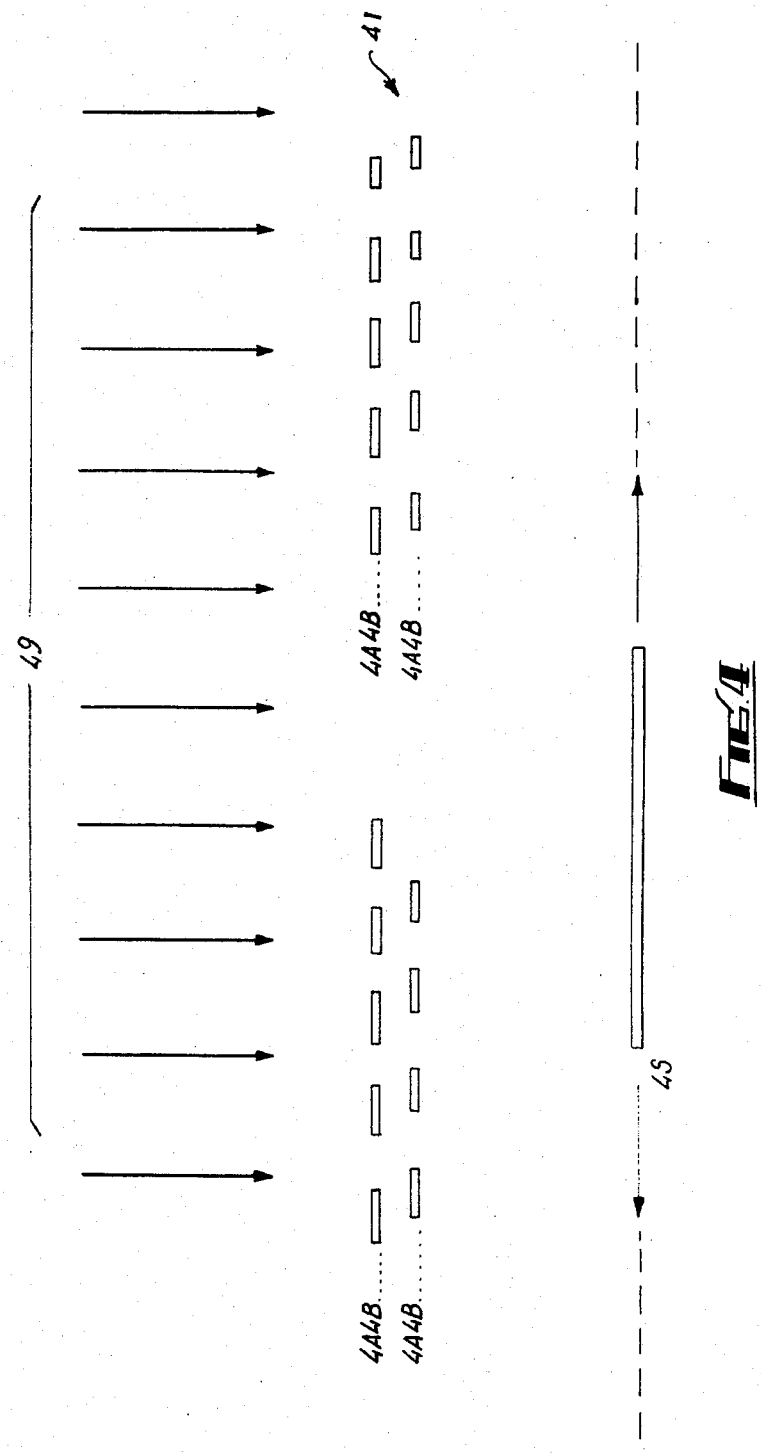

APPARATUS FOR AND A METHOD OF MODIFYING THE PROPERTIES OF A MATERIAL

The present invention relates to apparatus for and a method of modifying the properties of a material.

Modification of the properties of materials may be achieved by the creation of atomically mixed surface and sub-surface layers of other materials. This may be used for altering the mechanical, electrical, chemical or other properties of a surface and for the production of well-bonded surface films.

A known method of modification involves ion beam bombardment. Atomic mixing of two materials, S and A, by energetic ion beam bombardment occurs most effectively by Dynamic Recoil Mixing (DRM) when a film of constant optimum thickness of one material A, is maintained on the surface S, through the period of bombardment during which mixing takes place. Other materials B, C, D etc. may subsequently be introduced to produce more complex compounds.

In a known apparatus for ion beam bombardment two ion sources are employed, one to cause material from a target/targets to be sputtered on to the surface of a substrate while ions from a second ion source mix the atoms of this sputtered film with those of the substrate. The surface film is maintained at the optimum thickness by adjustment of the output from the two ion surfaces.

According to one aspect of the present invention, there is provided apparatus for modifying the properties of a material including means for producing a particle beam, means for mounting a substrate at a position spaced from the means for producing a particle beam, means for mounting a target at a position spaced from both the means for mounting the substrate and the means for producing a particle beam and means for producing relative movement between the particle beam, and the means for mounting a target, and/or the means for mounting the substrate whereby in operation a particle beam may impinge upon a target to displace material therefrom onto a substrate and impinge upon the substrate to intermix displaced material with the substrate.

According to another aspect of the present invention, there is provided a method of modifying the properties of a material including the steps of producing a particle beam, directing the beam at a target to displace material therefrom onto a substrate and then directing the beam onto the substrate to intermix displaced material with the substrate.

The particle beam may be an ion beam produced by a source of ions and directed within a vacuum environment. This may consist of an ion gun or an ion implanter employing isotope separation. The source, or an integral part thereof may be moved relative to target/s and/or substrate.

The substrate may be conducting, semiconducting or insulating. The substrate may be stationary or moveable.

A solid target or targets composed of the material/s to be dynamic recoil mixed into the substrate may be of pure elements or of alloys. The target/s may be of uniform or composite construction and may be stationary or moveable.

The impinging of particles on either the target/s or the substrate may be controlled in accordance with some programme in conjunction with information derived from sensors.

The particle beam/target sequence may be programmed to allow periods of bombardment of various targets so that layers of optimum thickness of materials A, B, C etc. are maintained on the substrate S, thereby undergoing atomic mixing during the period when S is bombarded. In addition, using the same technique, the rate of growth of ion-bombarded films A, B, C, etc. may be controlled. Additionally, high frequency and small amplitude scanning of the beam on the targets will allow mixing to occur along a pre-determined pattern on S or uniformly over the complete surface.

In order that the invention may be more clearly understood, several embodiments thereof will now be described, by way of example, with reference to the accompanying drawings in which.

Figure 1:
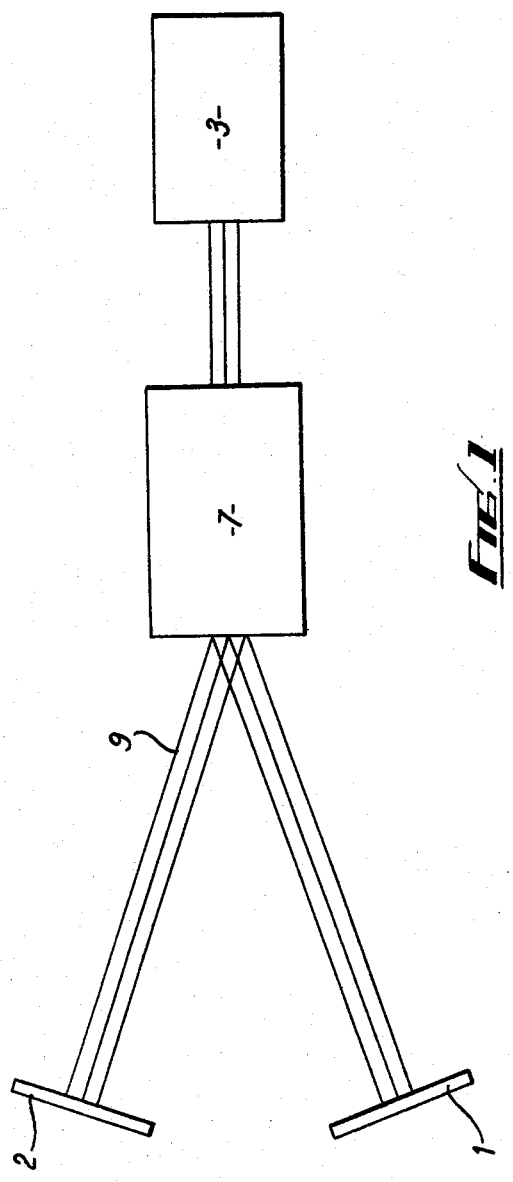
FIG. 1 shows a diagrammatic view of one embodiment of the apparatus of the invention in which an ion beam is alternately directed towards a substrate and target.
Figure 2:
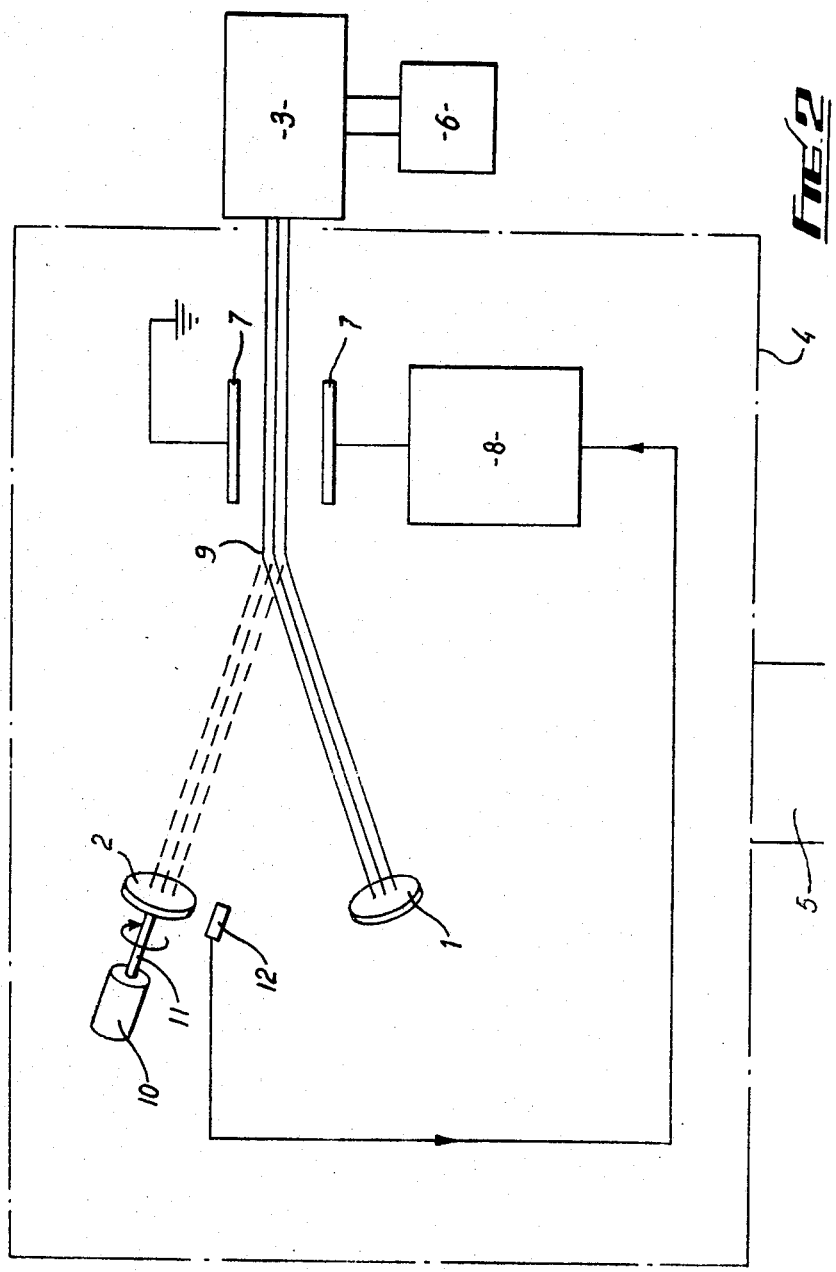
FIG. 2 shows a view of the apparatus of FIG. 1, but in more detail.
Figure 5A:
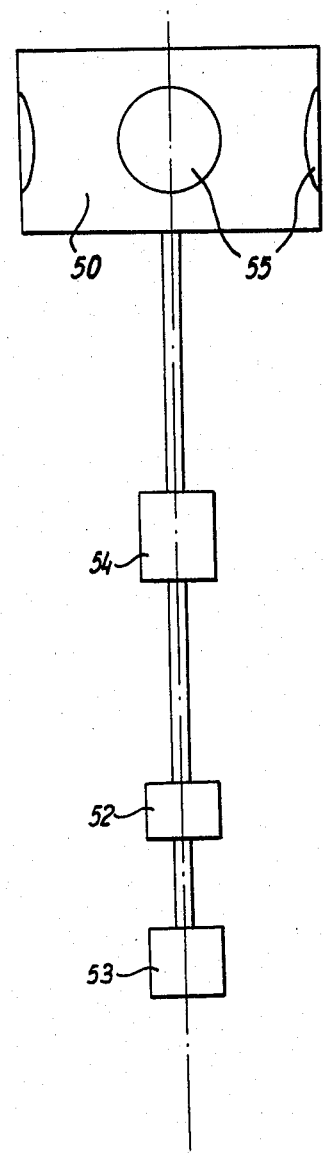
Figure 5B:
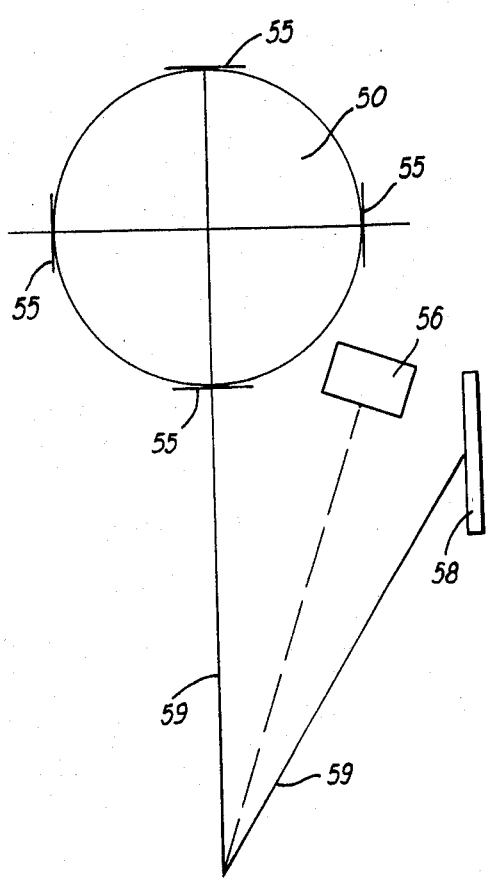

FIG. 3 shows an alternative embodiment to that of the FIGS. 1 and 2 utilising an alternative form of beam deflection, FIG. 4 shows a further embodiment of the invention, and FIGS. 5a and 5b show a possible modification of the embodiments of FIGS. 1 and 2 or 3.

A specific embodiment of the invention for the mixing of antimony from a target 1 into a silicon substrate 2 will now be described with reference to FIGS. 1 and 2 of the drawings.

A single ion source 3 is rigidly mounted to deliver ions in a vacuum chamber indicated by dashed line 4. The chamber 4 is conventionally evacuated through port 5 by an oil diffusion pump (not shown) capable of maintaining a pressure of $10^{-5}$ torr during the process. The ion source 3 has its own separate conventional oil diffusion pump 6. Argon gas of commercial purity is admitted to the source where it is ionized. An ion beam of rectangular section of area 4 cm×1 mm and current 10 mA is emitted from the source 3. The beam passes through an electrostatic deflection system consisting of two plates 7 of length 4 cm, height 6 cm and spacing 2 cm. The voltage across the plates 7 is determined by electronic circuitry 6 under the control of a microcomputer. The waveforms from the control circuitry 8 have a maximum amplitude of 4000 V which is sufficient to swing the ion beam 9 between the antimony target 1 and the substrate 2. Superimposed upon this waveform is a smaller raster waveform which can scan the beam over the entire surface of either the target or the substrate.

A high purity (99.9%) antimony target with dimensions 5 cm×2 cm is mounted at an angle of 20° to the undeflected ion beam 9. A silicon substrate of diameter 3 cm is mounted at an angle of 20° to the undeflected beam and hence makes an angle of 40° with the target 1. The distance between the target 1 and the substrate 2 is ~3 cm. The substrate 2 is rotated by a motor 10 about a central axis 11 normal to the plane at a speed of 500 rpm in order to minimise variations in thickness across the substrate 2 and to ensure uniformity of dose.

When the beam 9 is directed to the antimony target 1 antimony atoms are sputtered from the target 1 and are deposited on the silicon substrate 2 at a rate of ~−5 Å/sec. After 20 seconds sufficient antimony has been sputtered on to the substrate (to a thickness of 100Å) the beam 9 is transferred to the recoil mixing mode in which repetitive cycles of substrate bombardment followed by sputtering from the target is performed. With the ion beam flux specified the beam 9 spends 4 seconds on the target 1 after which it is swung to the substrate 2 where it is scanned over the surface for a period of 0.1 seconds. The beam 9 then returns to the target for a further 4 seconds.

The process is monitored by a quartz crystal monitor 12 located adjacent to the substrate 2 which receives sputtered antimony and which is bombarded by the ion beam 9 at the same rates as is the substrate 2. The resonant frequency of the crystal is reduced during the sputtering phase (because the crystal mass is increased) and is increased during the bombardment phase (because the crystal mass is reduced by back sputtering of the deposited film of antimony on the crystal). The resonant frequency of the crystal is detected by causing the crystal to control the frequency of oscillation of an electronic oscillator circuit. This information is in turn fed back to the control circuitry computer which governs the potentials on the deflector plates 7. The temperature of the quartz crystal monitor 12 is maintained at the temperature of the substrate 2 by mounting both on the same temperature controlled block. The temperature of the antimony target 1 is also separately controlled.

The process continues for approximately 9 minutes which results in an antimony dose of $-10^{17}$ ions/cm$^2$ dynamic recoil mixed into the silicon substrate 2.

As alternatives to the above described arrangement for directing the ion beam on to the target/s and substrate, the ion beam may be deflected electrostatically or magnetically according to a programmed electronic control signal to scan on to a substrate S on which the film is deposited and also a geometrically fixed target or an array of targets of different materials.

FIG. 3 shows a schematic diagram of an ion beam 39 from an ion source 33 with electrostatic scanning plates 37, substrate to be modified S, and materials to be mixed A, B and C.

FIG. 3a shows the beam position when depositing material A, B, C etc. on to S

FIG. 3b shows the beam position during intervals when atomic mixing is proceeding.

Atomic mixing can be carried out by deflecting the ion beam (referenced 39) using a voltage $-V$ on a pair of deflecting plates 37.

Whilst the beam 39 is incident on sputtering target A, a film of A may be built up on the substrate S to any desired optimum thickness. Then the ion beam 39 may be deflected on to the substrate S to cause atomic mixing of film A on the substrate. Further periods of mixing and build-up can be continued indefinitely. The sputtering time, the mixing time and the ion beam intensity may also be varied to control the rate of growth of the film. At any stage a linear motor (not shown) can be instructed to insert, in turn, other materials B, C etc. The substrate is rotated about a central axis 31 normal to its plane by an electric motor 30. A small additional oscillatory voltage can be used to allow the beam to scan substrate S to give an increased area of coverage or to treat the substrate according to a pre-determined pattern.

The target/s, the substrate and/or the ion source or any integral part of the ion source may be moved mechanically with respect to the stationary ion beam according to a prescribed programme fed to the motor drive, the substrate being rotated as described directly above.

Both mechanical movement and electronic deflection may be used according to a prescribed programme.

An alternative recoil mixing arrangement which has potential for treatment of large areas is shown in FIG. 4. A broad or scanned ion beam 49 is incident upon a target 41 comprising two parallel grids or arrays of material 4A, or some combination of materials 4A, 4B, 4C etc. which are to be recoil mixed into substrate 4S. The substrate can be caused to move at a pre-determined speed relative to the beam 49 and the grids. The ion beam will sputter material 4A to 4S and at the same time a part of the beam is used for recoil mixing. The relative position of the two grids or arrays and the relative position between the grids and the beam will determine the deposition rate of material 4A on to 4S as well as the fluence of the ions incident on 4S. Hence, by controlling the relative geometrical positions of the two grids or arrays or the tilt of the arrays with the aid of a feedback signal from some sensor, for example, monitoring the thickness of film 4A on 4S, optimum conditions for recoil mixing of material 4A on 4S or controlled rates of growth of A on S may be accomplished. Such an arrangement avoids the necessity of swinging the beam between target and substrate.

In other respects the embodiments of FIGS. 3 and 4 are similar to that of FIGS. 1 and 2.

FIG. 5a is a diagrammatic perspective view illustrating a modification which enables production to be increased with apparatus of the types shown in FIGS. 1 to 3. A carousel 50 of substantially cylindrical form is provided to the external cylindrical face of which a plurality of substrates 55 are connected. The manner of attachment may be by clips 51 or any other suitable means. The carousel is rotated whilst being raised and lowered. For the purpose a variable speed electric motor 52 and a device 53 for raising and lowering are drivably connected to the carousel through a ferrofluidic drive 54. This enables several substrates to be treated simultaneously. The combined rotational and axial movement of the drive promotes a consistent treatment of the substrates over their whole areas. To reduce the risk of the beam 59 having an unwanted effect on neighbouring substrates to the one actually under treatment a stop 56 is provided. This is shown on FIG. 5b which shows the carousel in plan view. In this figure the target is referenced 58.

It will be appreciated that the above embodiment has been described by way of example only and that many variations are possible without departing from the scope of the invention.

What is claimed is:

1. Apparatus for modifying the properties of a substrate material, said apparatus comprising: a particle beam source; substrate mounting means supporting a substrate at a position spaced from said particle beam source; target mounting means at a position spaced from both said substrate mounting means and said particle beam source; and means for producing relative movement of the particle beam from said source between said target supporting means and said substrate supporting means, whereby a particle beam from said source may impinge upon a target supported by said target supporting means to displace material therefrom onto a substrate supported by said substrate supporting means and impinge upon the substrate to intermix displaced target material with the substrate.

2. Apparatus as in claim 1 in which said particle beam source comprises a source of ions.

3. Apparatus as in claim 1 in which said means for producing relative movement comprises means for moving the target supported by said target moving means.

4. Appartatus as in claim 1 in which said means for producing relative movement comprises means for moving the substrate supported on said substrate supporting means.

5. Apparatus as in claim 1 in which said means for producing relative movement comprises means for deflecting the particle beam produced by said particle beam source.

6. Apparatus as in claim 1, in which said target mounting means comprises means for mounting a plurality of targets of different materials.

7. Apparatus as in claim 6, in which said target mounting means comprises means for moving one target as a time into the path of the beam.

8. Apparatus as in claim 1, in which a sensor is provided monitoring substrate treatment.

9. Apparatus as in claim 1, in which said substrate mounting means comprises: a carousel which can accommodate a plurality of substrates; and means for moving the carousel to bring individual substrates sequentially into a position in the path of the beam.

10. A method of modifying the properties of a material including the steps of producing a particle beam, directing the beam at a target to displace material therefrom onto a substrate and then directing the beam onto the substrate to intermix displaced material with the substrate.

11. A method as claimed in claim 10, in which the beam is switched repeatedly between the target and the substrate.

12. A method as claimed in claim 10 in which the beam is directed at successive one of a plurality of targets.

13. A method as claimed in claim 10, in which the dwell time of the beam on target or substrate varies between switches.

* * * * *